United States Patent
Kwak et al.

(10) Patent No.: US 11,414,743 B2
(45) Date of Patent: *Aug. 16, 2022

(54) MULTILAYERED ZINC ALLOY PLATED STEEL MATERIAL HAVING EXCELLENT SPOT WELDABILITY AND CORROSION RESISTANCE

(71) Applicant: POSCO, Pohang-si (KR)

(72) Inventors: Young-Jin Kwak, Gwangyang-si (KR); Woo-Sung Jung, Gwangyang-si (KR); Tae-Yeob Kim, Gwangyang-si (KR)

(73) Assignee: POSCO, Pohang-si (KR)

( * ) Notice: Subject to any disclaimer, the term of this patent is extended or adjusted under 35 U.S.C. 154(b) by 102 days.

This patent is subject to a terminal disclaimer.

(21) Appl. No.: 16/957,513

(22) PCT Filed: Dec. 13, 2018

(86) PCT No.: PCT/KR2018/015850
§ 371 (c)(1),
(2) Date: Jun. 24, 2020

(87) PCT Pub. No.: WO2019/132339
PCT Pub. Date: Jul. 4, 2019

(65) Prior Publication Data
US 2021/0002772 A1    Jan. 7, 2021

(30) Foreign Application Priority Data

Dec. 26, 2017  (KR) .......................... 10-2017-0180283

(51) Int. Cl.
*B32B 15/00* (2006.01)
*C23C 14/24* (2006.01)
(Continued)

(52) U.S. Cl.
CPC ............ *C23C 14/243* (2013.01); *C21D 8/005* (2013.01); *C22C 18/00* (2013.01); *C22C 38/002* (2013.01);
(Continued)

(58) Field of Classification Search
None
See application file for complete search history.

(56) References Cited

U.S. PATENT DOCUMENTS 4,401,727 A  *  8/1983  Berke .................. B32B 15/012
                                                          428/610
5,002,837 A  *  3/1991  Shimogori .............. C23C 14/16
                                                          428/621

(Continued)

FOREIGN PATENT DOCUMENTS

CN       1135537       11/1996
CN       101443132      5/2009
(Continued)

OTHER PUBLICATIONS

European Search Report—European Application No. 18896159.3 dated Jan. 13, 2021, citing JP H08-239754, EP 0730045, and U.S. Pat. No. 5,002,837.

(Continued)

*Primary Examiner* — Seth Dumbris
(74) *Attorney, Agent, or Firm* — Cantor Colburn LLP (57) ABSTRACT

Provided is a multilayered zinc alloy plated steel material comprising a base iron and multilayered plated layers formed on the base iron, wherein each of the multilayered plated layers is any one of a Zn-plated layer, a Mg-plated layer, and a Zn—Mg alloy-plated layer, and the ratio of the weight of Mg contained in the multilayered plated layers is 0.13-0.24 on the basis of the total weight of the multilayered plated layers.

19 Claims, 5 Drawing Sheets

(51) Int. Cl.

| | | |
|---|---|---|
| *C21D 8/00* | (2006.01) | |
| *C22C 18/00* | (2006.01) | |
| *C22C 38/00* | (2006.01) | |
| *C22C 38/02* | (2006.01) | |
| *C22C 38/04* | (2006.01) | |
| *C22C 38/06* | (2006.01) | |
| *C23C 14/16* | (2006.01) | |
| *C23C 14/22* | (2006.01) | |
| *C23C 28/02* | (2006.01) | |

(52) U.S. Cl.
CPC .............. *C22C 38/02* (2013.01); *C22C 38/04* (2013.01); *C22C 38/06* (2013.01); *C23C 14/16* (2013.01); *C23C 14/228* (2013.01); *C23C 14/24* (2013.01); *C23C 28/025* (2013.01); *C21D 2211/001* (2013.01); *Y10T 428/12799* (2015.01)

(56) References Cited

U.S. PATENT DOCUMENTS

| | | | |
|---|---|---|---|
| 5,648,177 | A | 7/1997 | Fukui et al. |
| 9,481,148 | B2 * | 11/2016 | Yasui ................... C23C 2/02 |
| 2010/0003538 | A1 | 1/2010 | Nikolov et al. |
| 2013/0199447 | A1 | 8/2013 | Nam et al. |
| 2015/0352812 | A1 | 12/2015 | Jung et al. |
| 2017/0350029 | A1 | 12/2017 | Hong et al. |
| 2018/0237900 | A1 * | 8/2018 | Kobayashi ............ C23F 13/14 |
| 2020/0002803 | A1 | 1/2020 | Kwak et al. |

FOREIGN PATENT DOCUMENTS

| | | | |
|---|---|---|---|
| CN | 104903493 | 9/2015 | |
| CN | 111032914 | 4/2020 | |
| EP | 0730045 | 9/1996 | |
| JP | H02141588 | 5/1990 | |
| JP | H083728 | 1/1996 | |
| JP | H08041627 | 2/1996 | |
| JP | H08081761 | 3/1996 | |
| JP | H08239754 | 9/1996 | |
| JP | 2624272 | 6/1997 | |
| JP | H09228030 | 9/1997 | |
| JP | H1068063 | 3/1998 | |
| JP | 2006265671 | 10/2006 | |
| JP | 2013545900 | 12/2013 | |
| KR | 19930010217 | 6/1993 | |
| KR | 19960031640 | 9/1996 | |
| KR | 20090122247 | 11/2009 | |
| KR | 20140083836 | 7/2014 | |
| KR | 20150071883 | 6/2015 | |
| KR | 20160054111 | 5/2016 | |
| KR | 20160054111 A * | 5/2016 | |
| KR | 20160077455 | 7/2016 | |
| KR | 101665880 | 10/2016 | |
| WO | WO-2017057639 A1 * | 4/2017 | ............... C23C 2/06 |

OTHER PUBLICATIONS

International Search Report—PCT/KR2018/015850 dated Mar. 22, 2019.
Chinese Office Action—Chinese Application No. 201880084583.7 dated Nov. 1, 2021, citing CN 1135537, CN 104903493, KR 10-2016-0054111, KR 10-1993-0010217, JP H08-081761, CN 111032914, CN 101443132.

* cited by examiner

MULTILAYERED ZINC ALLOY PLATED STEEL MATERIAL HAVING EXCELLENT SPOT WELDABILITY AND CORROSION RESISTANCE

TECHNICAL FIELD

The present disclosure relates to a multilayered zinc alloy plated steel material having excellent weldability and corrosion resistance, and more specifically, a multilayered zinc alloy plated steel material having excellent weldability and corrosion resistance which may be applied to a vehicle, a home appliance, a construction material, and the like.

BACKGROUND ART

A galvanizing method which may prevent corrosion of iron through cathodic protection may have excellent protection performance and may be highly economical such that the method has been widely used to manufacture a steel material having high corrosion resistance, and demand for a galvanized steel material, plated with zinc, has increased throughout the automobile, home appliance, construction material, and other industries.

Such a galvanized steel material may have a characteristic of sacrificial corrosion protection in which, when the steel material is exposed to corrosive environment, zinc having redox dislocation lower than that of iron may firstly be corroded, such that corrosion of the steel material may be prevented. Also, corrosion resistance of the steel material may improve by blocking the steel material from an oxidizing atmosphere as a dense corrosion product is formed on a surface of the steel material by oxidization of zinc of a galvanized layer.

However, due to industrial advancement, air pollution has increased, corrosion environment has been deteriorated, and strict restrictions have been made with respect to resource and energy conservation. Accordingly, it has been highly necessary to develop a steel material having corrosion resistance more improved than that of a general galvanized steel material. To this end, various studies into a technique of manufacturing a zinc alloy plated steel material which may improve corrosion resistance of a steel material by adding an element such as magnesium (Mg), and the like, to a plated layer, have been conducted.

Meanwhile, generally, a galvanized steel material or a zinc alloy plated steel material (hereinafter, referred to as "a zinc based plated steel material") may be processed to be a component by processing, or the like, may be welded through spot welding, or the like, and may be used as a product. In the case of a zinc based plated steel material using a high strength steel material, a high P added high strength interstitial-free (IF) steel material, or the like, which includes austenite or retained austenite as a microstructure, as a base, there may be a problem of liquid metal embrittlement (LME) in which zinc in a molten state permeates along a grain boundary of a base iron and causes embrittlement cracks during spot welding.

Figure 1:
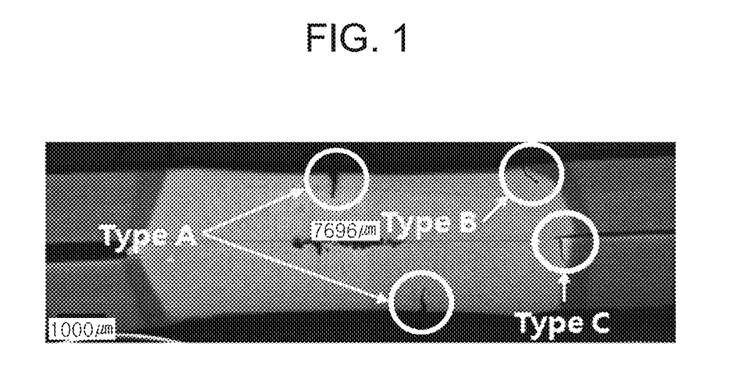
FIG. 1 is an enlarged image of a welded zone of a welded member in which LME crack is created by spot welding.

FIG. 1 is an enlarged image of a welded zone of a welded member in which the LME cracks are created by spot welding. In FIG. 1, the crack created on upper and lower portions of a nugget may be referred to as type A crack, the crack created on a welding shoulder portion may be referred to as type B crack, and the crack created in a steel sheet by misalignment of electrodes during welding may be referred to as type C crack. Among the cracks, as type B and C cracks may greatly affect stiffness of a material, the prevention of cracking during welding may be a core requirement factor in the respective field.

DISCLOSURE

Technical Problem

One purpose of the present invention is to provide a multilayered zinc alloy plated steel material having excellent weldability and corrosion resistance.

Technical Solution

One aspect of the present invention provides a multilayered zinc alloy plated steel material including a base iron and multilayered plated layers formed on the base iron, wherein one or more of the multilayered plated layers includes a Zn—Mg alloy plated layer, and at least one of the Zn—Mg alloy plated layers includes Mg by greater than weight % and equal to or lower than 35 weight %, and wherein a ratio of a weight of Mg contained in the multilayered plated layers to a total weight of the multilayered plated layers is 0.13-0.24.

Advantageous Effects

As one of various effects of the present invention, a multilayered zinc alloy plated steel material according to the present invention may have excellent weldability, and accordingly, even when a high strength steel material, a high P added high strength interstitial-free (IF) steel material, or the like, which includes austenite or retained austenite as a microstructure, is used as a base, liquid metal embrittlement (LME) may be effectively prevented, which may be an advantage.

Also, the multilayered zinc alloy plated steel material according to the present invention may secure excellent corrosion resistance even with a small coating amount, and accordingly, the multilayered zinc alloy plated steel material may be eco-friendly and highly economical, which may be an advantage.

Also, the multilayered zinc alloy plated steel material according to the present invention may have excellent coatability, which may be an advantage.

Also, the multilayered zinc alloy plated steel material according to the present invention may have excellent phosphating property.

The various and beneficial advantages and effects of the present invention are not limited to the above-described features, and may be more easily understood in the process of describing a specific embodiment of the present invention.

BEST MODE FOR INVENTION

In the case of a Zn—Mg alloy plated layer, an increase of a content of Mg may be advantageous in terms of corrosion resistance, but may be disadvantageous in terms of spot weldability. Accordingly, generally, a content of Mg in the plated layer may be managed to be 10 weight % at maximum. That is because, as a Zn—Mg based intermetallic compound having a low melting point in the plated layer may be easily dissolved and may cause liquid metal embrittlement. However, according to a result of additional research of the present inventors, it has been found that, even when a content of Mg in a plated layer exceeds 10 weight %, if the content is within a certain content range, spot weldability may rather considerably improve. Particularly, the effect of improvement of spot weldability as above may be applied to the case in which a plated layer is formed as a single layer, and also to the case in which a plated layer includes multiple layers, two or more layers, and accordingly, it has been found that the effects of improvement of coatability, improvement of phosphating property, and the like, may be additionally fulfilled, and the present invention has been completed.

In the description below, a zinc alloy plated steel material having excellent weldability and corrosion resistance will be described in greater detail. In the present invention, upper and lower portions of the steel sheet may be changed depending on a piling state. Thus, it should be noted that the description "being on," "on a base iron," for example, may indicate that an element is in contact with a base iron, and does not indicate that the element is disposed on an upper portion in terms of a height.

The zinc alloy plated steel material of the present invention may include a base iron, and multilayered plated layers formed on the base iron. In the present invention, a shape of the base iron is not limited to any particular shape. For example, the base iron may be a steel sheet of a steel wire rod.

Also, in the present invention, an alloy composition of the base iron is not limited to any particular composition. As an example, the base iron may include, by weight %, 0.10-1.0% of C, 0.5-3% of Si, 1.0-25% of Mn, 0.01-10% of Al, 0.1% or less of P (excluding 0%), 0.01% or less of S (excluding 0%), and a balance of Fe and other impurities. In this case, the contents of C, Si, Mn, P, and S may satisfy relational formula 1 as below. Meanwhile, the base iron having a composition as above may include austenite and retained austenite as a microstructure.

[C]+[Mn]/20+[Si]/30+2[P]+4[S]0.3    [Relational Formula 1]

where each of [C], [Mn], [Si], [P], and [S] refers to a content (weight %) of a respective element.

When the steel material has an alloy composition and a microstructure as above, liquid metal embrittlement (LME) may be a problem, and the reason is as follows. An austenite and retained austenite structure may have a weak grain boundary as compared to the other structure, and when stress is applied by spot welding, liquid molten zinc may permeate into a grain boundary of an austenite and retained austenite structure and may create cracks, and accordingly, liquid metal embrittlement, embrittlement fracture, may occur.

However, in the present invention, as described above, as the time for which liquid molten zinc is retained is significantly reduced, even when a zinc alloy plated steel material is manufactured using a steel material having the alloy composition and the microstructure as above as a base, liquid metal embrittlement may be effectively prevented. However, the present invention may also be applied even when the alloy composition of the base iron does not satisfy the above range.

Each of the multilayered plated layers may include one or more of a Zn plated layer and an Mg plated layer in addition to the Zn—Mg alloy plated layer. However, an example in which the multilayered plated layers are only formed of a Zn—Mg alloy plated layer is not excluded.

In the present invention, a ratio of a weight of Mg contained in the multilayered plated layers to a total weight of the multilayered plated layers may be 0.13-0.24, which is a main technical feature. A more preferable range thereof may be 0.157-0.20.

One or more of the multilayered plated layers may include a Zn—Mg alloy plated layer. At least one of the Zn—Mg alloy plated layers may include Mg by greater than 18 weight % and equal to or lower than 35 weight % preferably.

Figure 2:
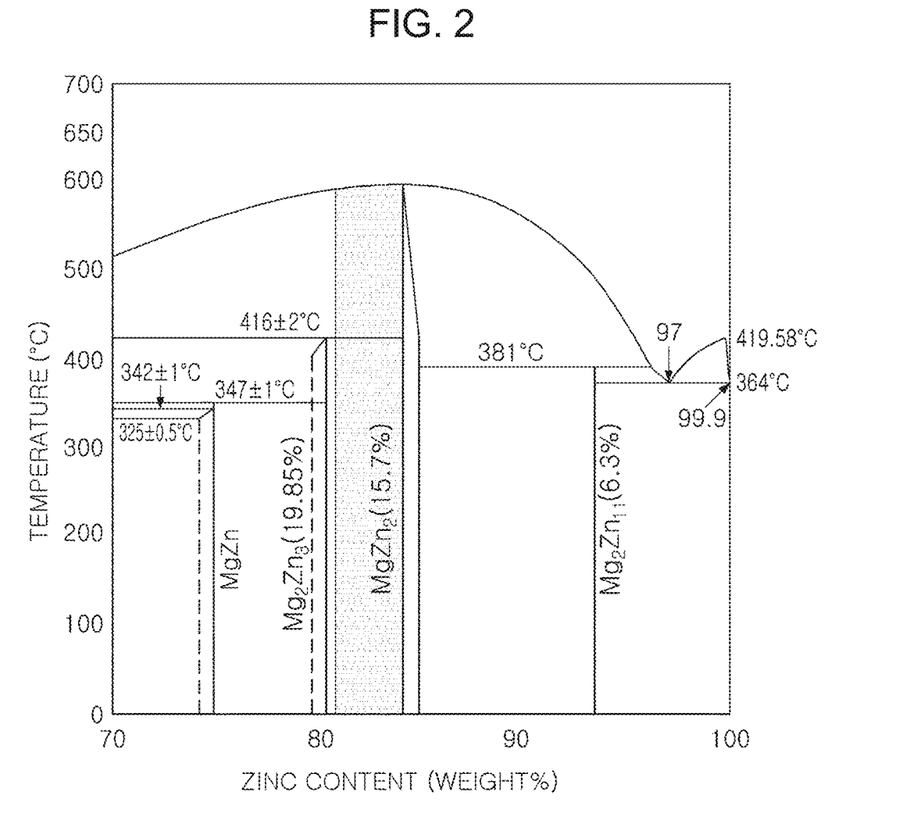
FIG. 2 is a phase equilibrium diagram of Mg—Zn binary alloy.

In the case of the Zn—Mg alloy plated layer, a plated structure may include a Zn single phase, an Mg single phase, an $Mg_2Zn_n$ alloy phase, an $MgZn_2$ alloy phase, an $MgZn$ alloy phase, an $Mg_7Zn_3$ alloy phase, and the like. The present inventors have found that a content of Mg contained in the multilayered plated layers is controlled to be the range as above, the multilayered plated layers on a welded zone may melt during spot welding and may be changed to a single alloy layer including an $MgZn_2$ alloy phase of 90 area % or higher (including 100 area %), and that in this case, liquid metal embrittlement (LME) may be effectively prevented. That is because, presumably, as a melting point of the plated layer is high, the time for which the melted plated layer is retained in a liquid state may be significantly reduced, as indicated in FIG. 2, a phase equilibrium diagram of Mg—Zn binary alloy. Meanwhile, in the present invention, a remaining structure other than an $MgZn_2$ alloy phase in the single alloy layer on the welded zone may not be particularly limited, but according to an embodiment, although not limited thereto, the remaining structure other than an $MgZn_2$ alloy phase may be an $Mg_2Zn_n$ alloy phase.

A phase fracture may be analyzed and measured using a standardless Rietveld quantitative analysis method using a general XRD, and also a TEM-based crystal orientation mapping technique (TEM-ASTAR) which is more precise, but an example embodiment thereof is not limited thereto. Meanwhile, a process of phase transformation of a Zn—Mg alloy plated layer may be analyzed using a high temperature in-situ radiation beam XRD. More specifically, a process of phase transformation of a Zn—Mg alloy plated layer may be analyze by heating an XRD spectrum per one frame at every 1 second and consecutively measuring 900 frames during a cooling heat cycle while a sample is heated at a heating rate of 1.3° C./sec and 11.3° C./sec and at a heating temperature of 780° C., but an example embodiment thereof is not limited thereto.

According to a result of an additional research of the present inventors, even when a content of Mg is controlled to be the range as above, in the case in which a deviation of a content of Mg is excessive in a width direction (a direction perpendicular to a rolling direction) of the plated layer, it may be difficult to fulfill the aim of improving spot weldability. Considering this, it may be necessary to appropriately manage an upper limit of a deviation of a content of Mg in a width direction of the plated layer, and it may be preferable to manage a deviation of a content of Mg to be within ±5% when a Glow Discharge Spectroscopy (GDS) profile is measured at a central portion of each of the multilayered plated layers in a thickness direction.

Figure 3:
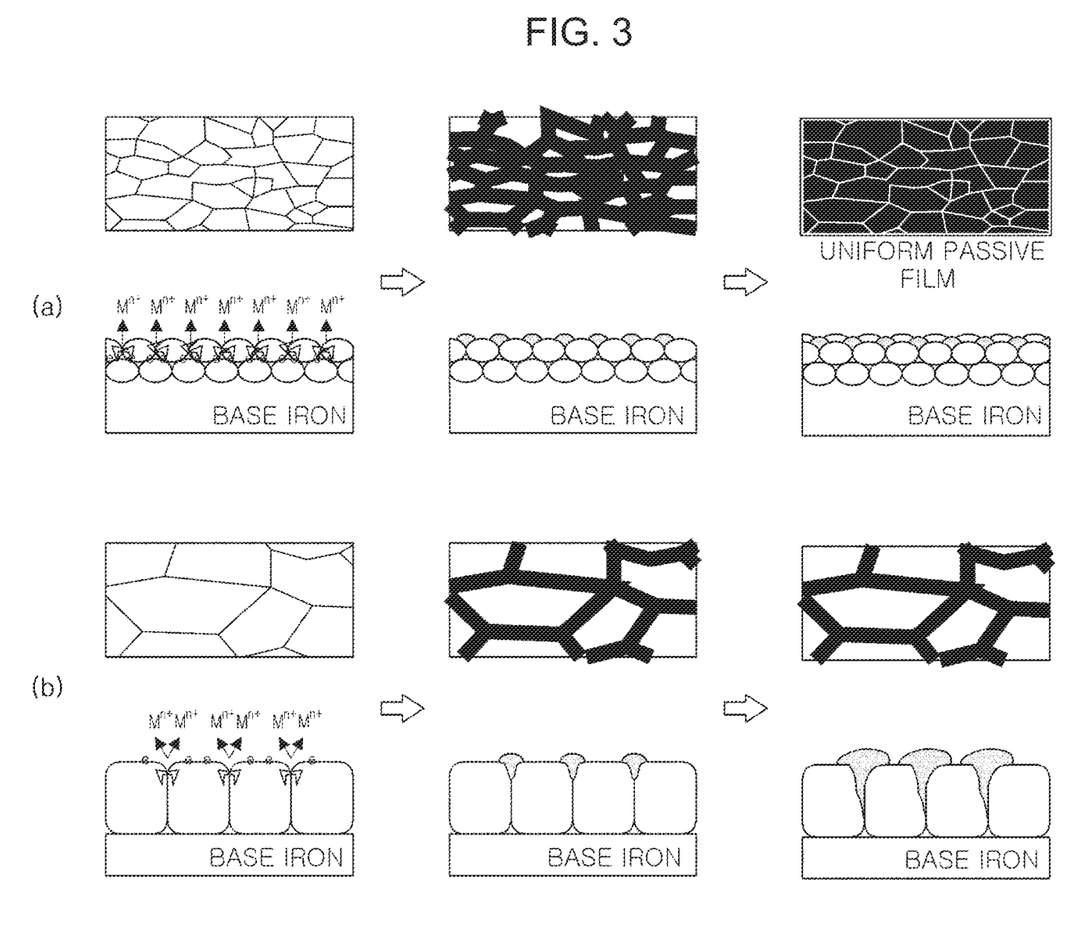
FIG. 3 is a diagram illustrating a process of corrosion of a plated steel material.

According to a result of an additional research of the present inventors, an average grain size of grains forming the multilayered plated layers may greatly affect corrosion resistance of the plated steel material. FIG. 3 is a diagram illustrating a process of corrosion of the plated steel material. FIG. 3(a) is a diagram illustrating an example in which a grain size is relatively fine, and FIG. 3(b) is a diagram illustrating an example in which a grain size is relatively coarse. Referring to FIG. 3, it has been indicated that, when a grain size is fine, a dense and uniform corrosion product may be formed when the plated steel material corrodes, which may be relatively advantageous to corrosion delay.

Also, an average grain size of grains forming the multilayered plated layers may greatly affect spot weldability of the plated steel material. When an average grain size of grains is a certain level or lower, type B crack may considerably decrease, and that is because, presumably, as atoms in the melted plated layer may actively move such that it may be advantageous to securing an aimed structure.

As described above, considering both aspects of corrosion resistance and spot weldability of the plated steel material, it may be necessary to appropriately mange an upper limit of an average grain size of grains forming the multilayered plated layers, and it may be preferable to manage an average grain size of grains forming the multilayered plated layers to be 100 nm or less (excluding 0 nm). Here, an average grain size may refer to an average long diameter of grains detected by observing a cross-sectional surface of the plated layer in a thickness direction.

According to an example, a sum of coating amounts of the multilayered plated layers may be 40 g/m$^2$ or less (excluding 0 g/m$^2$). The greater the sum of coating amounts of the multilayered plated layers, it may be more advantageous in terms of corrosion resistance. However, due to an increase of coating amount, liquid metal embrittlement (LME) may be caused during spot welding, and thus, an upper limit thereof may be limited to the above-mentioned range in consideration of an aspect of weldability. Meanwhile, a more preferable range of the sum of coating amounts of the multilayered plated layers in consideration of both aspects of corrosion resistance and spot weldability may be 10-35 g/m$^2$, and an even more preferable range may be 15-30 g/m$^2$.

Meanwhile, as described above, the zinc alloy plated steel material of the present invention is characterized in that the zinc alloy plated steel material may have multilayered plated layers, two or more layers, and accordingly, effects of improvement of coatability, improvement of phosphating property, and the like, along with the effect of improvement of corrosion resistance and weldability described above may be fulfilled. Thus, in the description below, the example will be described in detail with reference to a specific embodiment.

Figure 4:
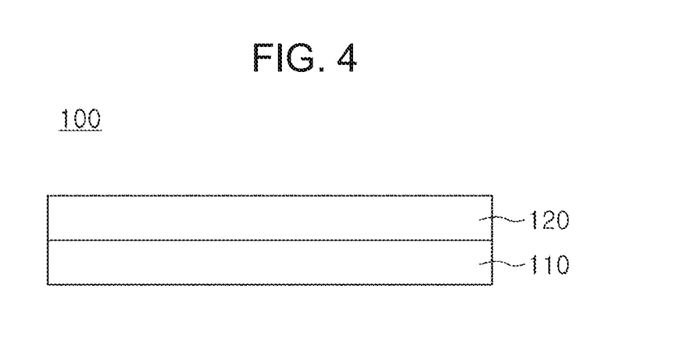
FIG. 4 is a diagram illustrating a multilayered zinc alloy plated steel material (100) according to an embodiment of the present invention.

FIG. 4 is a diagram illustrating a multilayered zinc alloy plated steel material (100) according to an embodiment of the present invention.

According to an embodiment of the present invention, the multilayered plated layers may include a first plated layer 110 formed on the base iron, and a second plated layer 120 formed on the first plated layer 110. The first plated layer 110 may be formed of a Zn single phase or a Zn single phase and a Zn—Mg alloy phase, a content of Mg in the plated layer is 7 weight % or less, and the second plated layer may be formed of a Zn—Mg alloy plated layer. In this case, each plated layer may further include an additional alloy phase other than a Zn single phase, an Mg single phase, and a Zn—Mg alloy phase.

An Zn—Mg alloy phase such as an Mg$_2$Zn$_n$ alloy phase, an MgZn$_2$ alloy phase, an MgZn alloy phase, and an Mg$_7$Zn$_3$ alloy phase may be intermetallic compounds, and the compounds may have high hardness, and may have high embrittlement such that coatability may degrade, and the plated layer may be detached during processing the zinc alloy plated steel material. Accordingly, the present inventors tried to provide ductility to the first plated layer 110 formed adjacent to the base iron to compensate for increased embrittlement of the plated layer, and as a means to achieve this, it has been found that, when the first plated layer 110 is formed of a Zn plated layer or a Zn—Mg alloy plated layer including 7 weight % or less of Mg (preferably, 6.3 weight % or less, and more preferably, 5.5 weight % or less), plating adhesion may considerably improve.

According to an example, the first plated layer 110 may be formed of a composite phase of a Zn single phase and a Zn—Mg alloy phase, and in this case, the first plated layer 110 may include 20 area % or higher of a Zn single phase. When the first plated layer 110 includes a structure as above, compression strength may be excellent, and accordingly, the first plated layer 110 may absorb and buffer stress caused by processing such that coatability may be excellent.

According to an example, a coating amount of the first plated layer 110 may be 3 g/m$^2$ or higher. In an embodiment, by controlling the coating amount to be the range as above, an aimed effect of improvement of coatability may be sufficiently secured. In an embodiment of the present invention, a coating amount of 3 g/m$^2$ may correspond to a thickness of 0.6 μm.

Figure 5:
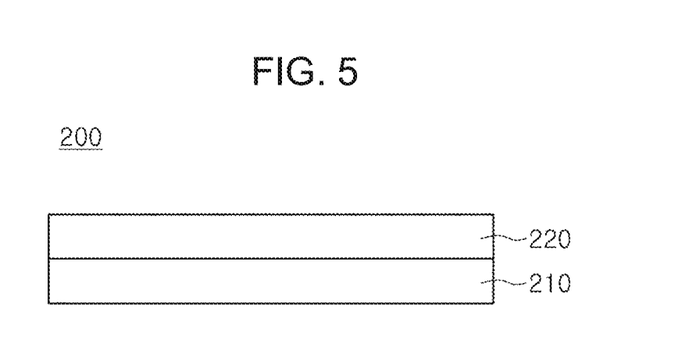
FIG. 5 is a diagram illustrating a multilayered zinc alloy plated steel material (200) according to another embodiment of the present invention.

FIG. 5 is a diagram illustrating a multilayered zinc alloy plated steel material (200) according to another embodiment.

According to another embodiment of the present invention, the multilayered plated layers may include a first plated layer 210 and a second plated layer 220 formed on the first plated layer 210, the first plated layer 210 may be formed of a Zn—Mg alloy phase, the second plated layer 220 may be formed of a Zn single phase or a Zn single phase and a Zn—Mg alloy phase, and a content of Mg in the plated layer may be 2 weight % or less. In this case, each plated layer may further include an additional alloy phase other than a Zn single phase, an Mg single phase, and a Zn—Mg alloy phase.

When a Zn—Mg alloy phase is present on an outermost surface of a zinc alloy plated steel material (200) by a certain level or higher, phosphating property may be deteriorated. That is because dissolution of the plated layer may be facilitated as galvanic corrosion occurs due to a difference in corrosion dislocations between Ni ions contained in a phosphating solution and a Zn—Mg alloy phase, and consequently, a pit in which the base iron is exposed may occur. Considering this, the second plated layer 220 disposed on an outermost surface of the zinc alloy plated steel material may be only formed of a Zn single phase, or it may be preferable to control a fraction of a Zn—Mg alloy phase to be a certain level or lower, and accordingly, phosphating property of the second plated layer 220 may effectively improve.

According to an example, a coating amount of the second plated layer 220 may be 2 g/m² or higher. In an embodiment of the present invention, when a coating amount of the second plated layer 220 is controlled to be the range as above, an aimed effect of improvement of phosphating property may be sufficiently secured.

Figure 6:
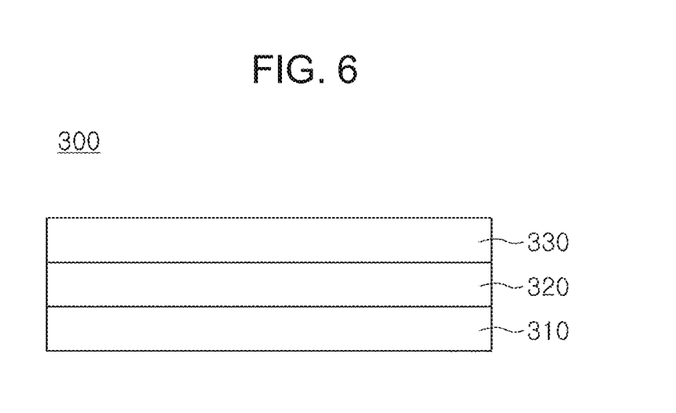
FIG. 6 is a diagram illustrating a multilayered zinc alloy plated steel material (300) according to another embodiment of the present invention.

FIG. 6 is a diagram illustrating a multilayered zinc alloy plated steel material (300) according to another embodiment of the present invention.

According to another embodiment of the present invention, the multilayered plated layers may include first to third played layers 310, 320, and 330 formed on the base iron in sequence, the first plated layer 310 may be formed of a Zn single phase or a Zn single phase and a Zn—Mg alloy phase, a content of Mg in the plated layer is 7 weight % or less, the second plated layer 320 may be formed of a Zn—Mg alloy phase, the third plated layer 330 may be formed of a Zn single phase or a Zn single phase and a Zn—Mg alloy phase, and a content of Mg in the plated layer may be 2 weight % or less. In each plated layer, each plated layer may further include an additional alloy phase other than a Zn single phase, an Mg single phase, and a Zn—Mg alloy phase.

When the zinc alloy plated steel material includes the first to third played layers 310, 320, and 330 in sequence, corrosion resistance, spot weldability, coatability, and phosphating property may improve overall, which may be an advantageous.

The first plated layer 310 may be formed of a composite phase of a Zn single phase and an Mg2Zn11 alloy phase, and in this case, the first plated layer 310 may include 20 area % or higher of a Zn single phase. When the first plated layer 310 includes the structure as above, compression strength may be excellent, and accordingly, the first plated layer 310 may absorb and buffer stress caused by processing such that coatability may be excellent.

A coating amount of the first plated layer may be 3 g/m² or higher, and a coating amount of the third plated layer may be 2 g/m² or higher.

Other than the configuration in which the plated layers include three layers, the elements overlapping the elements relevant to the zinc alloy plated steel material according to an embodiment different from the aforementioned embodiment of the present invention may be applied in the same manner.

The zinc alloy plated steel material of the present invention described above may be manufactured by various methods, and a method of manufacturing the same is not limited to any particular method. However, as one embodiment thereof, the zinc alloy plated steel material may be manufactured by the method as follows.

Firstly, a base iron may be prepared and may be pickled, rinsed, and dried using 14 weight % or higher of HCl aqueous solution, foreign objects and a natural oxide film on a surface may be removed using plasma, ion beams, or the like, and thereafter, multilayered plated layers may be formed in sequence, thereby manufacturing a zinc alloy plated steel material.

Each of the multilayered plated layers may be formed by an electrical plating method or a general vacuum deposition method, an electron beam method, a sputtering method, a thermal evaporation method, an induction heating evaporation method, an ion plating method, or the like. Among the methods, it may be preferable to form an Mg plated layer or a Zn—Mg alloy plated layer using an electromagnetic levitation physical vapor deposition having an electromagnetic stirring effect.

Figure 7:
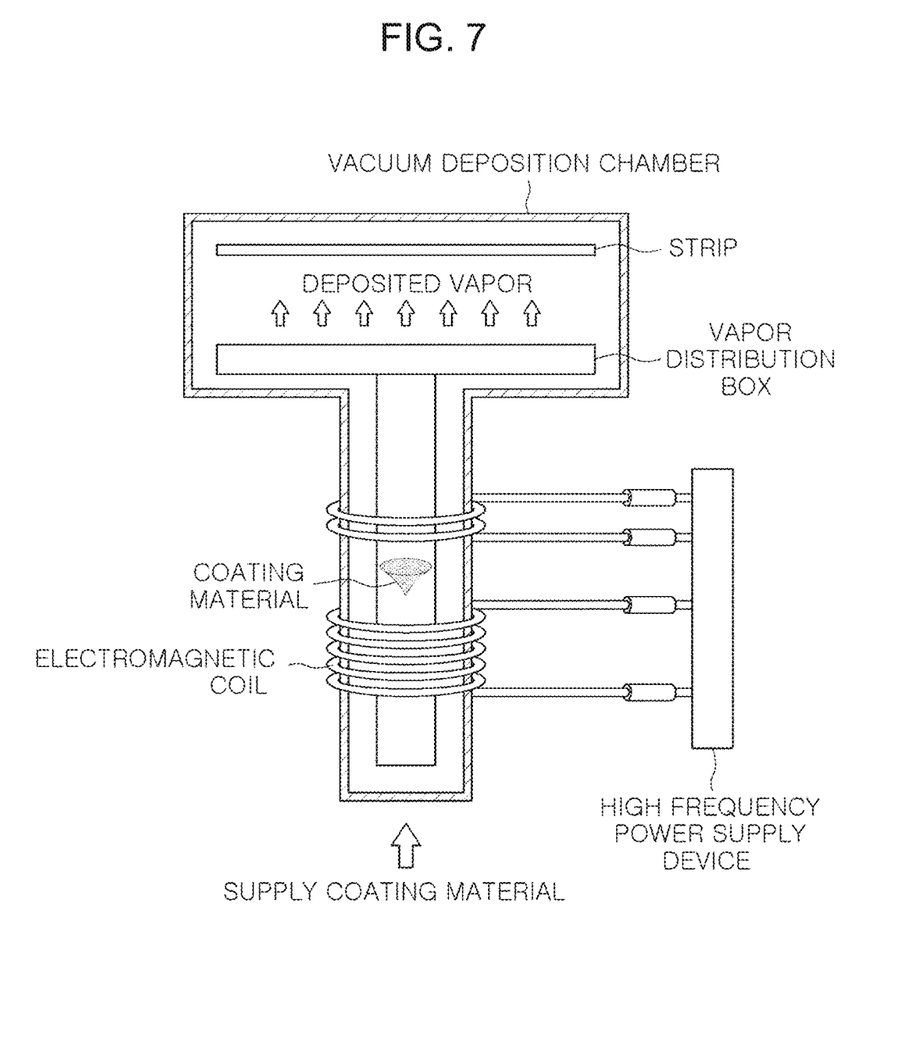
FIG. 7 is a diagram illustrating an electromagnetic levitation physical vapor deposition device.

Here, an electromagnetic levitation physical vapor deposition may use a phenomenon in which, when electromagnetic force is generated by applying high frequency power to a pair of electromagnetic coils generating an alternating current (AC) electromagnetic field, a coating material (in the present invention, Zn, Mg, or a Zn—Mg alloy) may levitate in the air without any help from the outside in the space surrounded by an AC electromagnetic field, and the levitated coating material as above may generate a large amount of deposited vapor (metal vapor), and FIG. 7 illustrates a diagram illustrating a device for electromagnetic levitation physical vapor deposition. Referring to FIG. 7, the large amount of deposited vapor formed by the method as above may be sprayed onto a surface of the base iron through a plurality of nozzles of a vapor distribution box at a high speed and may form plated layers.

In a general vacuum deposition device, a coating material may be provided in a crucible, and vaporization of a coating material may be performed by heating of the crucible including the coating material. In this case, due to the melting of the crucible, heat loss caused by the crucible, and the like, there may be a difficulty in supplying sufficient thermal energy to the coating material. Accordingly, a deposition speed may be slow, and there may also be a limitation in refining a size of grains forming the plated layer. Also, to deposit the Zn—Mg alloy vapor as in the present invention, there may also be a limitation in securing homogeneity of the plating layer.

However, differently from the above-described example, when the deposition is performed using a electromagnetic levitation physical vapor deposition method, a coating material may be exposed to high temperature without constraints according to temperature, and accordingly, high speed deposition may be available, and consequently, refinement of a size of grains forming the formed plated layer and homogenization of alloy element distribution in the plated layer may be achieved, differently from a general vacuum deposition method.

It may be preferable to adjust a vacuum degree in the vacuum deposition chamber to be $1.0 \times 10^{-3}$ mbar-$1.0 \times 10^{-5}$ mbar during the deposition process, and in this case, an increase of embrittlement and degradation of properties caused by the formation of oxide may be effectively prevented in the plated layer forming process.

It may be preferable to adjust the temperature of the levitated coating material to be 700° C. or higher during the deposition process, and it may be more preferable to adjust the temperature to be 800° C. or higher, and it may be even more preferable to adjust the temperature to be 1000° C. or higher. When the temperature is less than 700° C., there may be a concern that the effect of refinement of grains and homogenization of the plated layer may not be sufficiently secured. Meanwhile, the higher the temperature of the levitated coating material, it may be more advantageous to achieve an aimed technical effect. Therefore, in the present invention, an upper limit thereof is not limited to any particular temperature, but the temperature is a certain level or higher, the effect may be saturated, and also process costs may excessively increase. Considering this, an upper limit thereof may be limited to 1500° C.

It may be preferable to adjust a temperature of the base iron before and after the deposition to be 100° C. or lower. When the temperature exceeds 100° C., due to curvature in a width direction caused by non-uniformity of temperature of a width steel sheet, the maintained vacuum degree may be interfered while passing through an outlet-side multilevel differential decompression system.

MODE FOR INVENTION

In the description below, an example embodiment of the present disclosure will be described in greater detail. It should be noted that the example embodiments are provided to describe the present disclosure in greater detail, and to not limit the present disclosure. The scope of rights of the present disclosure may be determined based on the matters recited in the claims and the matters able to be rationally inferred therefrom.

Embodiment

A high strength cold-rolled steel sheet for a vehicle having a thickness of 1.4 mm which included, by weight %, a 0.16% of C, 1.43% of Si, 2.56% of Mn, 0.04% of Al, 0.006% of P, 0.0029% of S, and a balance of Fe and other impurities may be prepared, and a multilayered zinc alloy plated steel material having multilayered plated layers having a composition as in Table 1 was manufactured using a device (vacuum degree $3.2\times10^{-3}$ mbar) illustrated in FIG. 7. In overall examples, each played layer was obtained through a separate process in a separate vacuum chamber, and while each plated layer was formed, a current applied to a pair of electromagnetic coils was 1.2 kA, a frequency applied to a pair of electromagnetic coils was 60 kHz with reference to 2 kg of a deposition material, a temperature of a levitated coating material was 1000° C., and a temperature of a vapor distribution box was 900° C. constantly. Also, a temperature of the base iron before and after the deposition of each plated layer was constant to be 60° C.

Thereafter, a coating amount and a weight ratio of Mg of the multilayered zinc alloy plated steel material manufactured by inductively coupled plasma (ICP) were measured. More specifically, the steel sheet was cut out to a sample of a size of 80 mm×80 mm, a surface was degreased, and primary basis weighing ($W_1$: 0.0000 g) was performed using a high-precision balance. Thereafter, a clamp was attached to a column exclusively used for a 0-Ring 54.5 mm dia on a front surface and the clamp was closely attached to prevent solution from leaking. Thereafter, 30 cc of 1:3 HCl solution was added, and two to three drops of inhibiter were added. After the generation of $H_2$ gas on the surface was terminated, the solution was collected in a 100 cc mass flask. In this case, the entire remaining amount on the surface was collected by 100 cc or less using a washing bottle. Thereafter, the sample was completely dried, secondary basis weighing ($W_2$) was performed, and a value obtained by dividing a difference between the primary basis weight value and the secondary basis weight value by a unit area was determined as a total coating amount. Meanwhile, a content of Mg was measured by an ICP method with respect to the collected solution, and the content was determined as a weight ratio of Mg.

Thereafter, a GDS profile was measured at a central portion of each of the multilayered plated layers in a thickness direction, and an average grain size of grains forming the multilayered plated layers was measured. According to a result of the measurement, a deviation of a content of Mg of overall examples was within ±5%, and an average grain size was 100 nm or less.

Thereafter, weldability, corrosion resistance, powdering resistance, and phosphating property were examined with respect to the manufactured multilayered zinc alloy plated steel material, and results thereof were listed in Table 2 below.

More specifically, as for weldability, a sample of a size of 40 mm×120 mm was cut out according to SEP 1220-2 standard, spot welding was performed on each sample 100 times, whether type B crack was created was examined and a size of the crack was measured, and weldability was examined based on the following criteria.

1. Very Good: Case in which no type B crack was created in overall samples

2. Good: Case in which type B crack was created in a portion of the samples or overall samples, and an average length of type B crack was 0.1 times or less a thickness of the base iron (the cold-rolled steel sheet)

3. Average: Case in which type B crack was created in a portion of the samples or overall samples, and an average length of type B crack was greater than 0.1 times and 0.2 times or less a thickness of the base iron (the cold-rolled steel sheet)

4. Defective: Case in which type B crack was created in a portion of the samples or overall samples, and an average length of type B crack was greater than 0.2 times a thickness of the base iron (the cold-rolled steel sheet)

As for corrosion resistance, each multilayered zinc alloy plated steel material was cut out to a sample of a size of 75 mm×150 mm, a brine spray test was performed under JIS 22371, an initial red rust formation time was measured, and corrosion resistance was examined based on the following criteria.

1. Good: Red rust formation time was two or more times longer than that of a galvanized steel sheet (GI steel sheet) of one-side coating amount of 60 g/m2

2. Average: Red rust formation time was the same as or two or more times longer than that of a galvanized steel sheet (GI steel sheet) of one-side coating amount of 60 g/m2

3. Defective: Red rust formation time was shorter than that of a galvanized steel sheet (GI steel sheet) of one-side coating amount of 60 g/m2

As for powdering resistance, the multilayered zinc alloy plated steel material was cut out to a sample of a size of 40 mm×80 mm, the sample was mounted on a press testing device, a 60° bending test was performed, the sample was detached from the testing device, cellophane tape was attached to the bent region, the tape was detached, the detached tape was attached to a blank paper, a peeled width was measured, and powdering resistance was examined based on the following criteria.

1. Good: Case in which a peeled width was 6.0 mm or less

2. Average: Case in which a peeled width was greater than 6.0 mm and 8.0 mm or less 3. Defective: Case in which a peeled width was greater than 8.0 mm or less As for phosphating property, the multilayered zinc alloy plated steel material was cut out to a sample of a size of 75 mm×150 mm, surface adjustment and phosphating were performed according to standard of a general automobile company, and phosphate uniformity was examined.

1. Good: A phosphate film was uniformly formed

2. Defective: A phosphate film was non-uniformly formed

TABLE 1

| No. | First Plated layer Type (weight %) | First Plated layer Coating Amount (g/m²) | Second Plated Layer Type (weight %) | Second Plated Layer Coating Amount (g/m²) | Third Plated Layer Type (weight %) | Third Plated Layer Coating Amount (g/m²) | Mg Weight Ratio | Note |
|---|---|---|---|---|---|---|---|---|
| 1 | Zn | 5 | Zn-Mg (16.5% Mg) | 15 | — | — | 0.124 | Comparative Example 1 |
| 2 | Zn | 5 | Zn-Mg (17.0% Mg) | 15 | — | — | 0.128 | Comparative Example 2 |
| 3 | Zn | 5 | Zn-Mg (18.7% Mg) | 15 | — | — | 0.140 | Inventive Example 1 |
| 4 | Zn | 5 | Zn-Mg (20.7% Mg) | 15 | — | — | 0.155 | Inventive Example 2 |
| 5 | Zn | 5 | Zn-Mg (21.0% Mg) | 15 | — | — | 0.158 | Inventive Example 3 |
| 6 | Zn | 5 | Zn-Mg (22.0% Mg) | 15 | — | — | 0.165 | Inventive Example 4 |
| 7 | Zn | 5 | Zn-Mg (24.0% Mg) | 15 | — | — | 0.180 | Inventive Example 5 |
| 8 | Zn | 5 | Zn-Mg (26.0% Mg) | 15 | — | — | 0.195 | Inventive Example 6 |
| 9 | Zn | 5 | Zn-Mg (29.3% Mg) | 15 | — | — | 0.219 | Inventive Example 7 |
| 10 | Zn | 5 | Zn-Mg (32.0% Mg) | 15 | — | — | 0.240 | Inventive Example 8 |
| 11 | Zn | 7 | Zn-Mg (35.0% Mg) | 15 | — | — | 0.238 | Inventive Example 9 |
| 12 | Zn | 5 | Zn-Mg (32.3% Mg) | 15 | — | — | 0.242 | Comparative Example 3 |
| 13 | Zn | 5 | Zn-Mg (32.6% Mg) | 15 | — | — | 0.245 | Comparative Example 4 |
| 14 | Zn-Mg (5.0% Mg) | 5 | Zn-Mg (22.3% Mg) | 15 | — | — | 0.180 | Inventive Example 10 |
| 15 | Zn-Mg (7.0% Mg) | 5 | Zn-Mg (21.3% Mg) | 15 | — | — | 0.159 | Inventive Example 11 |
| 16 | Zn-Mg (15.0% Mg) | 17 | Zn | 3 | — | — | 0.128 | Comparative Example 5 |
| 17 | Zn-Mg (28.5% Mg) | 17 | Zn | 3 | — | — | 0.242 | Comparative Example 6 |
| 18 | Zn | 5 | Zn-Mg (20.8% Mg) | 12 | Zn | 3 | 0.125 | Comparative Example 7 |
| 19 | Zn | 5 | Zn-Mg (27.5% Mg) | 12 | Zn | 3 | 0.165 | Inventive Example 12 |
| 20 | Zn | 10 | Zn-Mg (27.5% Mg) | 24 | Zn | 6 | 0.165 | Inventive Example 13 |
| 21 | Zn | 5 | Zn-Mg (30% Mg) | 12 | Zn | 3 | 0.180 | Inventive Example 14 |
| 22 | Zn | 5 | Zn-Mg (30% Mg) | 24 | Zn | 6 | 0.205 | Inventive Example 15 |
| 23 | Zn-Mg (3.0% Mg) | 3 | Zn | 9 | Zn-Mg (20.0% Mg) | 3 | 0.046 | Comparative Example 8 |
| 24 | Zn-Mg (5.0% Mg) | 5 | Zn | 10 | Zn-Mg (30.0% Mg) | 5 | 0.087 | Comparative Example 9 |
| 25 | Zn-Mg (7.0% Mg) | 15 | Zn | 5 | Zn-Mg (35.0% Mg) | 10 | 0.151 | Inventive Example 16 |
| 26 | Zn | 10 | Zn-Mg (26% Mg) | 15 | Zn-Mg (16% Mg) | 10 | 0.157 | Inventive Example 17 |
| 27 | Zn | 5 | Zn-Mg (27.5% Mg) | 5 | Zn-Mg (19% Mg) | 10 | 0.163 | Inventive Example 18 |
| 28 | Zn | 15 | Zn-Mg (31% Mg) | 10 | Zn-Mg (25% Mg) | 10 | 0.160 | Inventive Example 19 |
| 29 | Zn | 3 | Zn-Mg (32% Mg) | 4 | Zn-Mg (10% Mg) | 3 | 0.158 | Inventive Example 20 |
| 30 | Zn-Mg (10.0% Mg) | 5 | Zn-Mg (35.0% Mg) | 15 | Zn | 10 | 0.191 | Inventive Example 21 |
| 31 | Zn | 5 | Zn-Mg (40.8% Mg) | 12 | Zn | 3 | 0.245 | Comparative Example 10 |

TABLE 2

| No. | Coating Amount (g/m²) | Weldability | Corrosion Resistance | Powdering Resistance | Phosphating Property | Note |
|---|---|---|---|---|---|---|
| 1 | 20 | 4 | 1 | 1 | 2 | Comparative Example 1 |
| 2 | 20 | 3 | 1 | 1 | 2 | Comparative Example 2 |
| 3 | 20 | 2 | 1 | 1 | 2 | Inventive Example 1 |
| 4 | 20 | 2 | 1 | 1 | 2 | Inventive Example 2 |
| 5 | 20 | 1 | 1 | 1 | 2 | Inventive Example 3 |
| 6 | 20 | 1 | 1 | 1 | 2 | Inventive Example 4 |
| 7 | 20 | 1 | 1 | 1 | 2 | Inventive Example 5 |
| 8 | 20 | 1 | 1 | 1 | 2 | Inventive Example 6 |
| 9 | 20 | 2 | 1 | 1 | 2 | Inventive Example 7 |
| 10 | 20 | 2 | 1 | 1 | 2 | Inventive Example 8 |
| 11 | 22 | 2 | 1 | 1 | 2 | Inventive Example 9 |
| 12 | 20 | 3 | 1 | 1 | 2 | Comparative Example 3 |
| 13 | 20 | 3 | 1 | 1 | 2 | Comparative Example 4 |
| 14 | 20 | 1 | 1 | 1 | 2 | Inventive Example 10 |
| 15 | 20 | 1 | 1 | 2 | 2 | Inventive Example 11 |
| 16 | 20 | 3 | 1 | 3 | 1 | Comparative Example 5 |
| 17 | 20 | 3 | 1 | 3 | 1 | Comparative Example 6 |
| 18 | 20 | 3 | 1 | 1 | 1 | Comparative Example 7 |
| 19 | 20 | 1 | 1 | 1 | 1 | Inventive Example 12 |
| 20 | 40 | 2 | 1 | 1 | 1 | Inventive Example 13 |
| 21 | 20 | 1 | 1 | 1 | 1 | Inventive Example 14 |
| 22 | 35 | 2 | 1 | 1 | 1 | Inventive Example 15 |
| 23 | 15 | 4 | 1 | 1 | 2 | Comparative Example 8 |
| 24 | 20 | 4 | 1 | 1 | 2 | Comparative Example 9 |
| 25 | 30 | 2 | 1 | 2 | 2 | Inventive Example 16 |
| 26 | 35 | 1 | 1 | 1 | 2 | Inventive Example 17 |
| 27 | 20 | 1 | 1 | 1 | 2 | Inventive Example 18 |
| 28 | 35 | 1 | 1 | 1 | 2 | Inventive Example 19 |
| 29 | 10 | 1 | 1 | 1 | 2 | Inventive Example 20 |
| 30 | 30 | 1 | 1 | 1 | 1 | Inventive Example 21 |
| 31 | 20 | 3 | 1 | 1 | 1 | Comparative Example 10 |

Referring to FIG. 2, as for inventive example which satisfied overall conditions suggested in the present invention, it has been indicated that corrosion resistance and also spot weldability were very excellent. Further, it has been indicated that, to secure improved spot weldability, a weight ratio of Mg was 0.157-0.20, and it may be preferable to control a sum of coating amounts of the multilayered plated layers to be 35 g/m² or less.

Differently from the above embodiments, it has been indicated that comparative examples 1 to 10 did not satisfy the ranges suggested in the present invention such that spot weldability degraded.

Meanwhile, referring to FIG. 2, it has been indicated that, to improve plating adhesion (powdering resistance), it may be preferable to form a lowermost plated layer as a Zn plated layer or a Zn—Mg alloy plated layer including Mg by 7 weight % or less (excluding 0 weight %). Also, it has been indicated that, to improve phosphating property, it may be preferable to form an uppermost plated layer as a Zn plated layer or a Zn—Mg alloy plated layer including Mg by 2 weight % or less (excluding 0 weight %).

Figure 8:
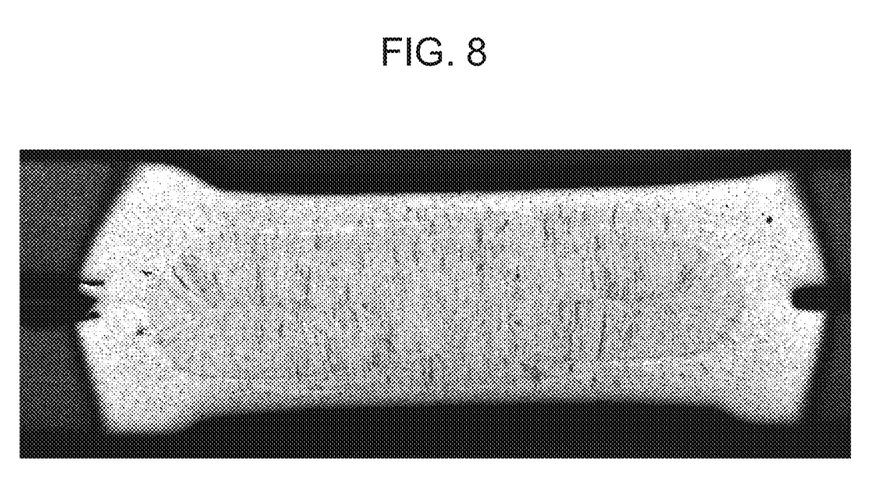
FIG. 8 is an image of a welded zone after spot welding for a multilayered zinc alloy plated steel material of inventive example 18.

FIG. 8 is an image of a welded zone after spot welding for a multilayered zinc alloy plated steel material. Referring to FIG. 8, the multilayered zinc alloy plated steel material was changed to a single alloy layer after welding, and a ratio of an MgZn2 alloy phase in the single alloy layer on the welded zone was 90 area % or higher, and it was visually confirmed that type B crack and also type C crack were not created at all.

The description of reference numerals in the drawings are as follows:
100, 200, 300: MULTILAYERED ZINC ALLOY PLATED STEEL MATERIAL
110, 210, 310: FIRST PLATED LAYER
120, 220, 320: SECOND PLATED LAYER
330: THIRD PLATED LAYER

The invention claimed is:

1. A multilayered zinc alloy plated steel material, comprising:
a base iron and multilayered plated layers formed on the base iron,
wherein one or more of the multilayered plated layers includes a Zn—Mg alloy plated layer, and at least one of the Zn—Mg alloy plated layers includes Mg by greater than 18 weight % and equal to or lower than 35 weight %,
wherein each of the multilayered plated layers is formed of one or more of a Zn single phase, an Mg single phase, and a Zn—Mg alloy phase, and
wherein a ratio of a weight of Mg contained in the multilayered plated layers to a total weight of the multilayered plated layers is 0.13-0.24.

2. The multilayered zinc alloy plated steel material of claim 1, wherein a ratio of a weight of Mg contained in the multilayered plated layers to a total weight of the multilayered plated layers is 0.157-0.20.

3. The multilayered zinc alloy plated steel material of claim 1, wherein, when a Glow Discharge Spectroscopy (GDS) profile is measured at a central portion of each of the multilayered plated layers in a thickness direction, a deviation of a content of Mg is within ±5%.

4. The multilayered zinc alloy plated steel material of claim 1, wherein an average grain size of grains forming the multilayered plated layers is 100 nm or less (excluding 0 nm).

5. The multilayered zinc alloy plated steel material of claim 1, wherein a sum of coating amounts of the multilayered plated layers is 40 g/m² or less (excluding 0 g/m²).

6. The multilayered zinc alloy plated steel material of claim 2, wherein a sum of coating amounts of the multilayered plated layers is 10~35 g/m².

7. The multilayered zinc alloy plated steel material of claim 1,
wherein, when the zinc alloy plated steel material is spot-welded, the multilayered plated layers on a welded zone change to a single alloy layer, and
wherein the single alloy layer on the welded zone includes an $MgZn_2$ alloy phase of 90 area % or higher (including 100 area %).

8. The multilayered zinc alloy plated steel material of claim 1, wherein, when spot-welding is performed according to SEP 1220-2 standard, an average length of type B crack is 0.1 times or less of a thickness of a base iron.

9. The multilayered zinc alloy plated steel material of claim 1, wherein each of the multilayered plated layers is formed by generating deposited vapor by levitating and heating a coating material by electromagnetic force in a vacuum chamber and induction-effusing the deposited vapor on a surface of a base iron.

10. The multilayered zinc alloy plated steel material of claim 1, wherein the base iron includes, by weight %, 0.10-1.0% of C, 0.5-3% of Si, 1.0-25% of Mn, 0.01-10% of Al, 0.1% or less of P (excluding 0%), 0.01% or less of S (excluding 0%), and a balance of Fe and other impurities.

11. The multilayered zinc alloy plated steel material of claim 10,
wherein contents of C, Si, Mn, P, and S included in the base iron satisfy relational formula 1 as below:

[C]+[Mn]/20+[Si]/30+2[P]+4[S]≥0.3     [Relational Formula 1]

where each of [C], [Mn], [Si], [P], and [S] refers to a content (weight %) of a respective element.

12. The multilayered zinc alloy plated steel material of claim 1, wherein the base iron includes one or more of austenite and retained austenite as a microstructure.

13. The multilayered zinc alloy plated steel material of claim 1,
wherein the multilayered plated layers include first and second plated layers formed on the base iron in sequence,
wherein the first plated layer is formed of a Zn single phase or a Zn single phase and a Zn—Mg alloy phase, and
wherein the second plated layer is the Zn—Mg alloy plated layer.

14. The multilayered zinc alloy plated steel material of claim 1,
wherein the multilayered plated layers include first and second plated layers formed on the base iron in sequence,
wherein the first plated layer is the Zn—Mg alloy plated layer, and
wherein the second plated layer is formed of a Zn single phase or a Zn single phase and a Zn—Mg alloy phase, and a content of Mg in the second plated layer is 2 weight % or lower.

15. The multilayered zinc alloy plated steel material of claim 1,
wherein the multilayered plated layers include first to third plated layers formed on the base iron in sequence,
wherein the first plated layer is formed of a Zn single phase or a Zn single phase and a Zn—Mg alloy phase, and a content of Mg in the plated layer is 7 weight % or lower,
wherein the second plated layer is the Zn—Mg alloy plated layer, and
wherein the third plated layer is formed of a Zn single phase or a Zn single phase and a Zn—Mg alloy phase, and a content of Mg in the third plated layer is 2 weight % or lower.

16. A multilayered zinc alloy plated steel material, comprising:
a base iron and multilayered plated layers formed on the base iron,
wherein the multilayered plated layers include first and second plated layers formed on the base iron in sequence, the first plated layer is formed of a Zn single phase or a Zn single phase and a Zn—Mg alloy phase, and the second plated layer is a Zn—Mg alloy plated layer,
wherein the Zn—Mg alloy plated layer includes Mg by greater than 18 weight % and equal to or lower than 35 weight %, and
wherein a ratio of a weight of Mg contained in the multilayered plated layers to a total weight of the multilayered plated layers is 0.13-0.24.

17. The multilayered zinc alloy plated steel material of claim 16, wherein a ratio of a weight of Mg contained in the multilayered plated layers to a total weight of the multilayered plated layers is 0.157-0.20.

18. A multilayered zinc alloy plated steel material, comprising:
a base iron and multilayered plated layers formed on the base iron,
wherein the multilayered plated layers include first and second plated layers formed on the base iron in sequence, the first plated layer is a Zn—Mg alloy plated layer, and the second plated layer is formed of a Zn single phase or a Zn single phase and a Zn—Mg alloy phase,
wherein the Zn—Mg alloy plated layer includes Mg by greater than 18 weight % and equal to or lower than 35 weight %, and a content of Mg in the second plated layer is 2 weight % or lower, and
wherein a ratio of a weight of Mg contained in the multilayered plated layers to a total weight of the multilayered plated layers is 0.13-0.24.

19. The multilayered zinc alloy plated steel material of claim 18, wherein a ratio of a weight of Mg contained in the multilayered plated layers to a total weight of the multilayered plated layers is 0.157-0.20.

* * * * *